(12) United States Patent
Karavakis et al.

(10) Patent No.: US 9,398,703 B2
(45) Date of Patent: Jul. 19, 2016

(54) VIA IN A PRINTED CIRCUIT BOARD

(71) Applicants: Konstantine Karavakis, Pleasanton, CA (US); Kenneth S. Bahl, Saratoga, CA (US)

(72) Inventors: Konstantine Karavakis, Pleasanton, CA (US); Kenneth S. Bahl, Saratoga, CA (US)

(73) Assignee: Sierra Circuits, Inc., Sunnyvale, CA (US)

( * ) Notice: Subject to any disclaimer, the term of this patent is extended or adjusted under 35 U.S.C. 154(b) by 117 days.

(21) Appl. No.: 14/281,802

(22) Filed: May 19, 2014

(65) Prior Publication Data

US 2015/0334836 A1    Nov. 19, 2015

(51) Int. Cl.
*H05K 1/03* (2006.01)
*H05K 3/38* (2006.01)
*H05K 3/42* (2006.01)

(52) U.S. Cl.
CPC .............. *H05K 3/387* (2013.01); *H05K 3/426* (2013.01); *H05K 2201/0221* (2013.01); *H05K 2201/0236* (2013.01); *H05K 2203/0709* (2013.01); *Y10T 29/49167* (2015.01)

(58) Field of Classification Search
CPC ............ H05K 1/00; H05K 1/05; H05K 1/11; H05K 3/00; H05K 3/42; H05K 3/44; H05K 3/46; H05K 1/03; C23C 18/20
USPC .......... 174/255, 257, 262, 258–260; 156/278; 216/18, 19, 52, 106; 29/848, 852; 428/323; 205/125; 442/173
See application file for complete search history.

(56) References Cited

U.S. PATENT DOCUMENTS

| | | | |
|---|---|---|---|
| 3,014,818 A | 12/1961 | Wildy | |
| 3,226,256 A | 12/1965 | Schneble, Jr. et al. | |
| 3,259,559 A | 7/1966 | John et al. | |
| 3,269,861 A | 8/1966 | Schneble et al. | |
| 3,322,881 A | 5/1967 | Schneble, Jr. et al. | |
| 3,370,974 A | 2/1968 | Hepfer | |
| 3,799,802 A | 3/1974 | Schneble et al. | |
| 3,925,138 A | 12/1975 | Shaul et al. | |
| 4,145,460 A * | 3/1979 | Finley et al. | 216/17 |
| 4,167,601 A | 9/1979 | Beckenbaugh et al. | |
| 4,188,415 A * | 2/1980 | Takahashi et al. | 427/470 |
| 4,248,921 A | 2/1981 | Steigerwald et al. | |

(Continued)

FOREIGN PATENT DOCUMENTS

DE    3121015        12/1982
EP    2120525 A1    11/2009

(Continued)

OTHER PUBLICATIONS

International Search Report and Written Opinion of the International Searching Authority for related application PCT/US2015/014615 mailed on May 20, 2015.

(Continued)

*Primary Examiner* — Xiaoliang Chen
(74) *Attorney, Agent, or Firm* — Douglas L. Weller

(57) ABSTRACT

A via in a printed circuit board is composed of a patterned metal layer that extends through a hole in dielectric laminate material that has been covered with catalytic adhesive material on both faces of the dielectric laminate material. The layer of catalytic adhesive coats a portion of the dielectric laminate material around the hole. The patterned metal layer is placed over the catalytic adhesive material on both faces of the dielectric laminate material and within the hole.

9 Claims, 3 Drawing Sheets

(56) References Cited

U.S. PATENT DOCUMENTS

| | | | |
|---|---|---|---|
| 4,287,253 A | 9/1981 | Leech | |
| 4,354,895 A | 10/1982 | Ellis | |
| 4,457,952 A | 7/1984 | Kawamoto et al. | |
| 4,581,301 A | 4/1986 | Michaelson | |
| 4,585,502 A * | 4/1986 | Uozu et al. | 156/278 |
| 4,770,900 A * | 9/1988 | Seibel | 430/314 |
| 4,908,242 A | 3/1990 | Hughes et al. | |
| 4,954,185 A | 9/1990 | Kohm | |
| 4,001,466 A | 7/1991 | Hoechst | |
| 5,153,987 A * | 10/1992 | Takahashi et al. | 29/852 |
| 5,200,720 A * | 4/1993 | Yi | 333/181 |
| 5,309,632 A | 5/1994 | Takahashi et al. | |
| 5,347,712 A * | 9/1994 | Yasuda et al. | 29/852 |
| 6,489,720 B1 * | 12/2002 | Gofuku et al. | 313/558 |
| 6,696,173 B1 | 2/2004 | Naundorf et al. | |
| 2002/0195716 A1 | 12/2002 | Magnuson et al. | |
| 2004/0134682 A1 * | 7/2004 | En et al. | 174/258 |
| 2004/0226745 A1 * | 11/2004 | En | 174/262 |
| 2008/0041615 A1 * | 2/2008 | Zhong et al. | 174/255 |
| 2013/0043062 A1 | 2/2013 | Wismann | |

FOREIGN PATENT DOCUMENTS

| | | |
|---|---|---|
| GB | 1208337 A | 10/1970 |
| WO | 2014041057 A1 | 3/2014 |

OTHER PUBLICATIONS

M-CAM International, LLC., Sierra Circuits Innovation Data Analysis, Appendix B—Selected Art of Interest for U.S. Appl. No. 14/281,802, 2015.

* cited by examiner

VIA IN A PRINTED CIRCUIT BOARD

BACKGROUND

The miniaturization of the electronics industry has put pressure in the printed circuit board (PCB) industry to create features of fine circuitry. The print and etch processes often used to create PCB's and PCB cores are not precise enough for fine features down to one mil lines and spaces and below. Instead, additive processes using catalytic laminates allows copper (Cu) plating to be performed selectively in photolithographically defined channels and vias using plating resist.

The structure of a multilayer board can be created in many different ways. One way is that no-catalytic cores are made by print and etch to create the circuitry on both sides. The cores are stuck up and laminated followed by drilling and circuitization of the outer layers and the holes.

DESCRIPTION OF THE EMBODIMENT

In the fabrication of printed circuit boards (PCBs), where routing of metal is difficult because of high density requirements and where outer layers can be formed at the end of the fabrication processes, then a catalytic adhesive coating can be applied on both sides of the PCB core. The coating can be made using the same or similar material used to make the laminate of the PCB core. This allows for good adhesion of metal traces. Fabrication of the outer layers of the PCB can be done using lasers to create blind vias and a photoimageable mask to create traces.

Figure 1:
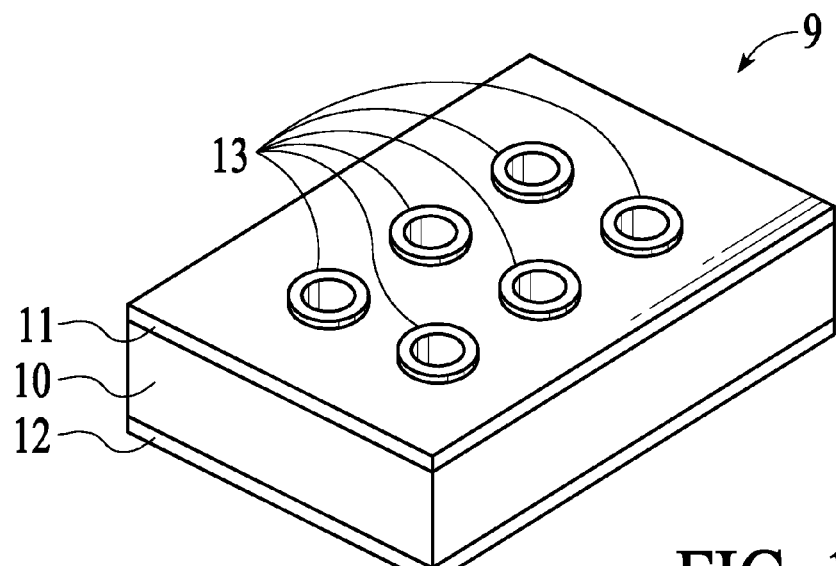
FIG. 1 shows a simplified diagram illustrated vias a printed circuit board in accordance with an implementation.

FIG. 1 illustrates vias in a portion of a printed circuit board (PCB) 9. Dielectric laminate material 10 functions as a PCB substrate (two-sided laminate core) and is composed of, for example, glass or non-glass reinforcement and a resin such as, for example, epoxy, polyimide, Teflon or any other type of resin suitable for inclusion in a PCB substrate. Dielectric laminate material 10 is, for example, approximately 0.028" thick and is sandwiched between a top adhesive layer 11 and a bottom adhesive layer 12. Top adhesive layer 11 and bottom adhesive layer 12 are, for example, each approximately 25 um (1 mil) thick. Top adhesive layer 11 and bottom adhesive layer 12 are composed of, for example, a dielectric adhesive such as an epoxy, polyimide, cyanate ester or another suitable dielectric adhesive. The dielectric adhesive includes, for example, both non-catalytic and catalytic filler particles. The catalytic filler particles are composed of, for example, a metal such as palladium (Pd), iron (Fe) and/or other catalytic particles used for copper plating where electroless copper (Cu) is reduced from its $Cu^{++}$ to Cu. For example, the catalytic particles can be made of inorganic filler with metal coated over the inorganic filler. For example, the inorganic filler can be silicon dioxide, kaolin, or some other inorganic filler with suitable properties for the particular application. Vias 13, for example, composed of copper, extend through top adhesive layer 11, dielectric laminate material 10 and bottom adhesive layer 12 allowing electrical connection between circuitry on different faces of PCB 9.

Figure 2:
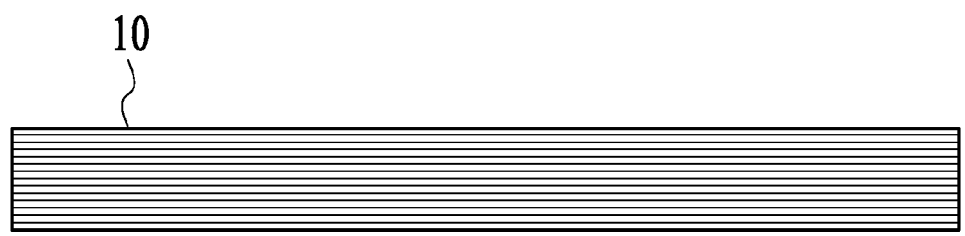
FIG. 2, FIG. 3, FIG. 4, FIG. 5, FIG. 6 and FIG. 7 illustrate steps in a process where vias are formed in a printed circuit board in accordance with an implementation.

A process for forming the vias is illustrated in FIGS. 2 through 7. Dielectric laminate material 10 is shown in FIG. 2.

Figure 3:
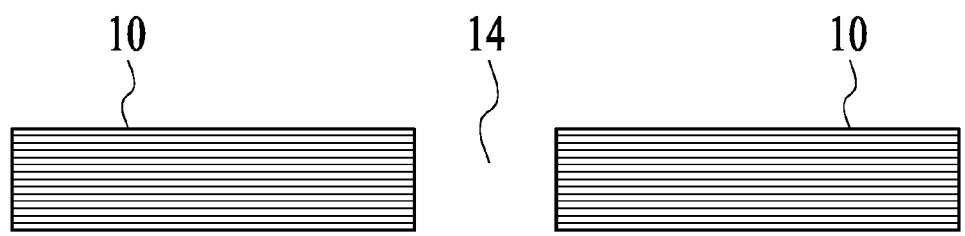
Figure 4:
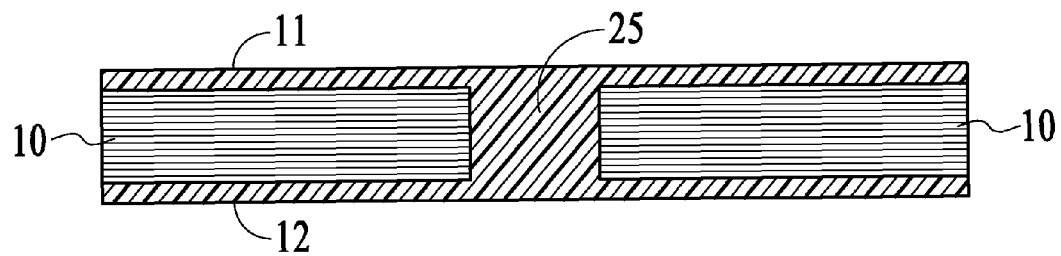

As illustrated by FIG. 3, for each via, a hole 14 is drilled in dielectric laminate material 10. Hole 14 is, for example, approximately 8 mil in diameter. The diameter of via holes will vary depending on application, available manufacturing processes and so on.

Both sides of dielectric laminate material 10 are coated with a catalytic adhesive to form top adhesive layer 11 and bottom adhesive layer 12. Hole 14 is also filled with catalytic adhesive material 25. For example, the catalytic adhesive material is composed of a dielectric adhesive such as an epoxy, polyimide, cyanate ester or another suitable dielectric adhesive. The reology (viscosity) of the adhesive is adjusted and is based on the type of method used to coat and fill the holes at the same time. The dielectric material contains catalytic particles that, for example, have a particle size in the range of 2 to 12 micrometer (um). Alternatively, other particle sizes can be used. For example, smaller particle sizes are better as bigger particle size may affect uniformity and roughness of copper plating placed on top adhesive layer 11 and bottom adhesive layer 12. For example, by weight the particles are between six and fifteen percent of the total weight of the catalytic adhesive material 25. This percentage is only an example as for various applications the weight of the particles may be some other percentage of the total weight of the catalytic adhesive material 25. The catalytic adhesive material is deposited using, for example, screen printing, stenciling, or squeegee coating using a coating machine such as those available from the ITC, Intercircuit, N.A., or another coating device able to perform or one or more of the known processes and techniques in the industry used to deposit material on a PCB substrate.

Figure 5:
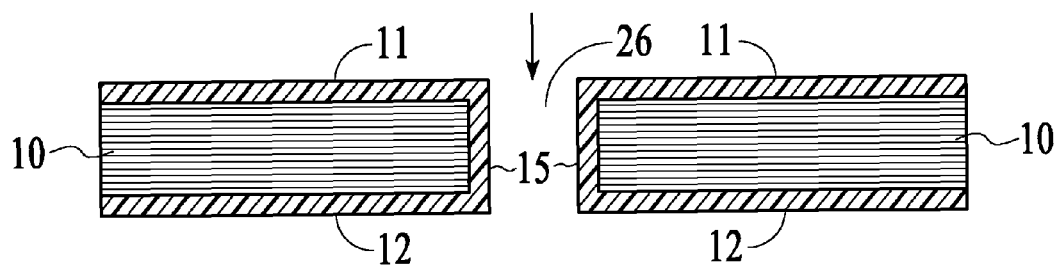

FIG. 5 illustrates a hole 26 drilled through catalytic adhesive material 25. For example, hole 26 is 6 mil in diameter, leaving a layer 15 of catalytic adhesive material around the diameter of hole 26. The diameter of hole 26 will vary depending on application, available manufacturing processes and so on.

Figure 6:
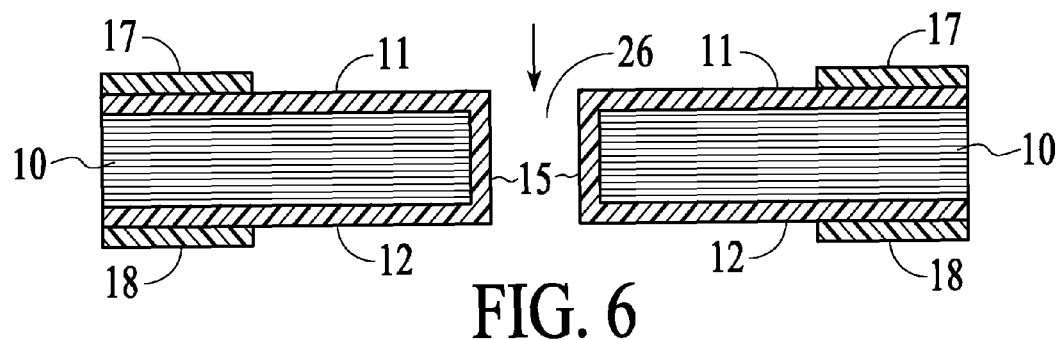

A layer of resist is applied over top adhesive layer 11 and bottom adhesive layer 12. The layer of resist is exposed to produce a resist pattern 17 over top adhesive layer 11 and a resist pattern 18 over bottom adhesive layer 12. The result is shown in FIG. 6.

Figure 7:
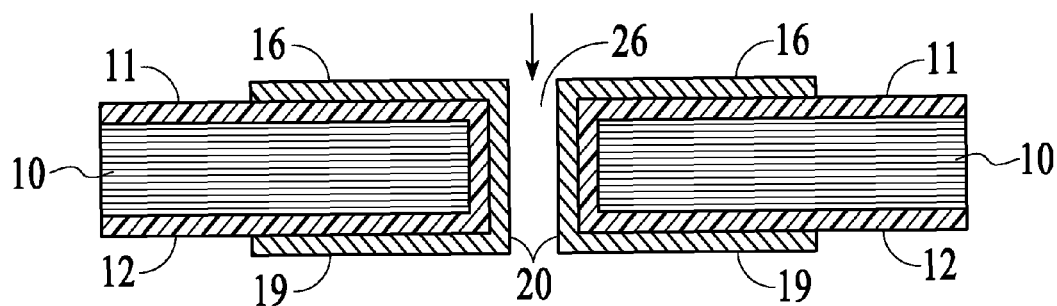

Full electroless copper plating is deposited leaving a copper patterned layer 16 over top adhesive layer 11 and a copper patterned layer 19 over bottom adhesive layer 12 where there is no resist. Copper regions 20 are also formed within hole 26. For example the thickness of copper patterned layer 19 and copper regions 20 is between 0.5-1.4 mils. The resist is stripped away, as shown in FIG. 7. The catalytic adhesive material around the diameter of hole 26 assures good adhesion of copper regions 20 within hole 26.

Copper patterned layer 16 and a copper patterned layer 19 function as traces for the PCB. After the traces are formed, exposed portions of top adhesive layer 11 and bottom adhesive layer 12 (i.e., those portions of top adhesive layer 11 and bottom adhesive layer 12 not covered by the traces) can (optionally) be removed, for example, by using plasma etch, laser ablation or some other process suitable to removing the adhesive layers without damaging copper plating.

One advantage of the above-described implementation is that there is no copper between the traces to etch away. For example, if instead of the described method above, a copper clad laminate and print and etch techniques are used to form the traces, this become problematic when trace width and space in the PCB is below 1 mil as copper particles left imbedded in the laminate surface can create near shorts. In the above-described implementation, any metal particles can be removed simply merely by removing the portions of top adhesive layer 11 and bottom adhesive layer 12 not covered by copper traces.

In addition, top adhesive layer 11 and bottom adhesive layer 12 aid in forming straight walls for copper patterned layer 16 and copper patterned layer 19. This is because use of adhesive layers allows copper patterned layer 16 and copper patterned layer 19 to be defined by resist pattern 17 and resist pattern 18. Using a resist pattern to form copper plating allows for better defined traces (i.e. traces with straighter wall formation) which helps in better trace electrical characteristics such as impedance and line signal loss. When copper traces are formed, for example, using a subtractive print and etch process, the cross section of the traces looks like a trapezoid rather than a square or rectangle as they appear when formed using resist.

Once the two-sided laminate core is circuitized, multilayer constructions can be made using known techniques such as applying additional catalytic adhesive over the circuitized layers and forming vias by laser or plasma to build additional layer(s).

Figure 8:
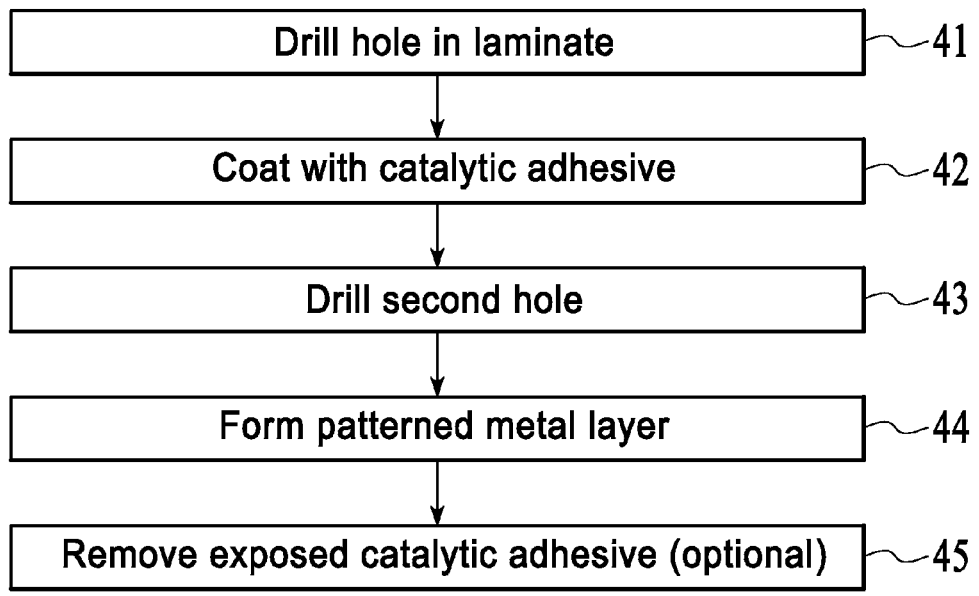
FIG. 8 is a flowchart summarizing a process where vias are formed in a printed circuit board in accordance with an implementation.

FIG. 8 summarizes the above-described implementation. In a block 41, a hole is drilled in dielectric laminate material. In a block 42, both faces of the dielectric laminate material are coated with a catalytic adhesive. This coating includes filling the hole in the catalytic adhesive.

In a block 43, a second hole is drilled through the catalytic adhesive where the catalytic adhesive fills the first hole. The second hole has a smaller diameter than the first hole so that a layer of catalytic adhesive remains at a diameter of the second hole.

In a block 44, a patterned metal layer is formed over the catalytic adhesive material on both faces of the dielectric laminate material. This includes placing the metal layer over the layer of catalytic adhesive that remains at the diameter of the second hole.

In an optional block 45, exposed portions of the catalytic adhesive material that are not covered by the patterned metal layer are removed.

Figure 9:
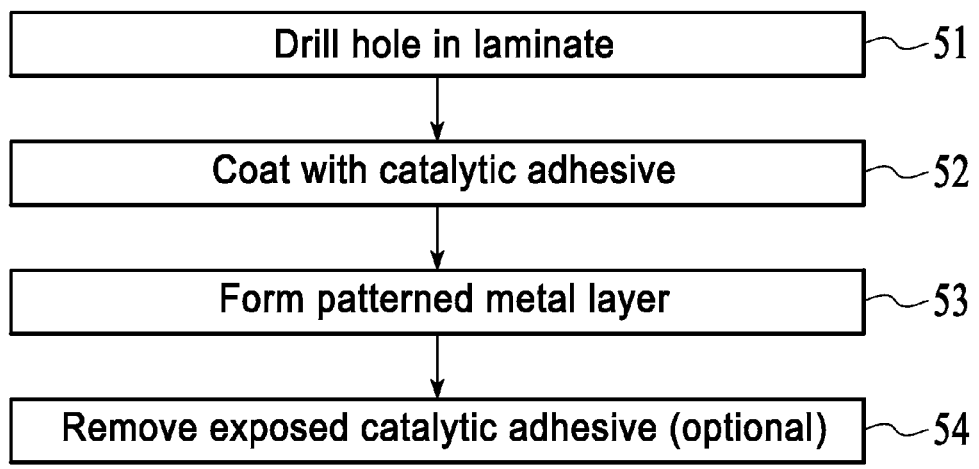
FIG. 9 is a flowchart summarizing a process where vias are formed in a printed circuit board in accordance with an alternative implementation.

FIG. 9 summarizes an alternative implementation. In a block 51, a hole is drilled in dielectric laminate material. In a block 52, both faces of the dielectric laminate material are coated with a catalytic adhesive. This coating does not fill the hole. For example, electrostatic spraying, spraying or some other coating process is performed, for example, using standard coating equipment in the industry, to coat the dielectric laminate material with the catalytic adhesive so that the walls of the hole is coated at the same time both faces of the dielectric laminate material are coated.

In a block 53, a patterned metal layer is formed over the catalytic adhesive material on both faces of the dielectric laminate material. This includes placing the metal layer over the layer of catalytic adhesive that is coated on the hole.

In an optional block 54, exposed portions of the catalytic adhesive material that are not covered by the patterned metal layer are removed.

The foregoing discussion discloses and describes merely exemplary methods and embodiments. As will be understood by those familiar with the art, the disclosed subject matter may be embodied in other specific forms without departing from the spirit or characteristics thereof. For example, after block 43 or block 52 a thin layer of copper (e.g., 1-2 um) can be plated in an electroless copper bath followed by block 44 or block 53, respectively. After the features are formed the thin copper layer on the substrate surface can be removed by chemical means. In addition, one way stack vias can be performed by filling a plated via with a dielectric material and then going through standard electroless copper plating followed by resist that exposes only the plugged via area and plating up more copper. Many of the steps can be eliminated by adding catalytic powder to the dielectric material filling the plated via with and then plating up the copper over the via using a fully additive electroless copper bath. Accordingly, the present disclosure is intended to be illustrative, but not limiting, of the scope of the invention, which is set forth in the following claims.

What is claimed is:

1. A printed circuit board, comprising:
dielectric laminate material in which has been drilled a hole, the dielectric laminate material being coated with a catalytic adhesive, catalytic adhesive also coating a portion of the dielectric laminate material around the hole, wherein the catalytic adhesive is a dielectric adhesive that includes catalytic filler particles composed of metal coated over silicon dioxide or kaolin; and,
a patterned metal layer over the catalytic adhesive on both faces of the dielectric laminate material, including a portion of the patterned metal layer over the layer of catalytic adhesive that coats the portion of the dielectric laminate material around the hole.

2. A printed circuit board as in claim 1, wherein the catalytic adhesive is removed from locations not covered by the patterned metal layer.

3. A printed circuit board as in claim 1 wherein the catalytic adhesive is a dielectric adhesive that includes non-catalytic and catalytic filler particles.

4. A printed circuit board as in claim 1 wherein the catalytic adhesive is a dielectric adhesive that includes catalytic filler particles composed of metal suitable as a catalyst for copper plating.

5. A printed circuit board as in claim 1 wherein the patterned metal layer is composed of copper.

6. A printed circuit board as in claim 1:
wherein the layer of catalytic adhesive extends all the way through the hole and on all interior walls of the hole; and,
wherein the patterned metal layer extends through the hole surrounded by the catalytic adhesive on the interior walls of the hole.

7. A printed circuit board as in claim 6 wherein the patterned metal layer extends through a second drilled hole that has been drilled in the catalytic adhesive layer on the interior walls of the hole, the second drilled hole making room for the patterned metal layer to extend through the hole drilled in the dielectric material, wherein the second drilled hole has a smaller diameter than the hole drilled in the dielectric material.

8. A printed circuit board as in claim 6 wherein the catalytic adhesive layer on the interior walls of the hole is sufficiently thin to allow space for the patterned metal layer to extend through the hole, the patterned metal layer extending through the hole being surrounded by the catalytic adhesive layer on the interior walls of the hole.

9. A printed circuit board as in claim 8 wherein the catalytic adhesive layer is electrostatic sprayed catalytic adhesive.

* * * * *